(12) United States Patent
Norman (10) Patent No.: US 8,164,656 B2
(45) Date of Patent: *Apr. 24, 2012

(54) MEMORY EMULATION IN AN IMAGE CAPTURE DEVICE

(75) Inventor: Robert Norman, Blaine, WA (US)

(73) Assignee: Unity Semiconductor Corporation

( * ) Notice: Subject to any disclaimer, the term of this patent is extended or adjusted under 35 U.S.C. 154(b) by 814 days.

This patent is subject to a terminal disclaimer.

(21) Appl. No.: 11/897,726

(22) Filed: Aug. 31, 2007

(65) Prior Publication Data

US 2009/0059036 A1 Mar. 5, 2009

(51) Int. Cl.
*H04N 5/76* (2006.01)
*G11C 11/34* (2006.01)
*G11C 16/04* (2006.01)

(52) U.S. Cl. ........... 348/231.9; 348/231.99; 365/185.29; 365/185.33

(58) Field of Classification Search ............... 348/231.9; 365/185.01–185.33
See application file for complete search history.

(56) References Cited

U.S. PATENT DOCUMENTS

| | | | |
|---|---|---|---|
| 6,034,882 A | 3/2000 | Johnson et al. | |
| 6,088,262 A * | 7/2000 | Nasu .................. | 365/185.04 |
| 7,460,385 B2 | 12/2008 | Gruber et al. | |
| 7,519,754 B2 * | 4/2009 | Wang et al. .................. | 710/110 |
| 2003/0151959 A1 | 8/2003 | Tringali et al. | |
| 2004/0170040 A1 * | 9/2004 | Rinerson et al. ................ | 365/26 |
| 2006/0050598 A1 | 3/2006 | Rinerson et al. | |
| 2006/0164882 A1 | 7/2006 | Norman | |
| 2006/0171200 A1 | 8/2006 | Rinerson et al. | |
| 2007/0195168 A1 * | 8/2007 | Wang et al. ................ | 348/207.1 |
| 2009/0016094 A1 * | 1/2009 | Rinerson et al. ............. | 365/148 |

OTHER PUBLICATIONS

U.S. Appl. No. 11/897,909, filed Aug. 30, 2007, Robert Norman.
U.S. Appl. No. 11/893,647, filed Aug. 16, 2007, Robert Norman.
U.S. Appl. No. 11/893,644, filed Aug. 16, 2007, Robert Norman.
U.S. Appl. No. 11/665,599, filed Jan. 19, 2007, Robert Norman.
U.S. Appl. No. 11/543,502, filed Oct. 5, 2006, Robert Norman.
U.S. Appl. No. 11/506,385, filed Aug. 16, 2006, Robert Norman.
U.S. Appl. No. 11/478,163, filed Jun. 28, 2006, Robert Norman.
U.S. Appl. No. 11/449,105, filed Jun. 6, 2006, Robert Norman.

* cited by examiner

*Primary Examiner* — Nhan T Tran
*Assistant Examiner* — Chia-Wei A Chen (57) ABSTRACT

An image capture device using a memory array that is directly addressed and non-volatile is disclosed. The memory array can be used to replace and emulate multiple memory types such as DRAM, SRAM, non-volatile RAM, a non-volatile memory card, and FLASH memory, for example. The memory array may be randomly accessed. Data stored in the memory array is retained in the absence of electrical power. One or more memory arrays may be used in the image capture device. At least one of the memory arrays may be in the form of a removable memory card.

22 Claims, 7 Drawing Sheets

MEMORY EMULATION IN AN IMAGE CAPTURE DEVICE

FIELD OF THE INVENTION

The present disclosure relates to electronic systems. More specifically, the present disclosure relates to memory technology in an image capture device.

BACKGROUND

Memory is required for any device that stores instructions and/or data. Memory can either be classified as volatile or nonvolatile. Volatile memory is memory that loses its contents when the power is turned off. In contrast, non-volatile memory may not require a continuous power supply to retain information. Non-volatile memories may use solid-state memory devices as memory elements.

One type of volatile memory is random access memory (RAM). As the name suggests, RAM may be accessed in any order so long as the address, or intersecting row (word line) and column (bit line), of the desired cells are known.

There are several kinds of RAM. One type is dynamic random access memory (DRAM). DRAM is named for its refresh operation. In DRAM, a transistor and capacitor are used to create a memory cell. The capacitor holds electrons that represent a bit of data (i.e., a 1 or a 0), while the transistor is used as a switch to read the capacitor or to change its state. However, the capacitor begins to lose the electrons immediately and uses the refresh procedure, prior to the electrons discharging past the 50% mark, to hold a state of 1. That is, the central processing unit (CPU), or a memory controller, may be used to charge the capacitors that have a state of 1. This refreshing operation allows the capacitors to maintain that high state while actively discharging. Refreshing occurs automatically thousands of time per second, and consumes CPU time and resources.

DRAM may be configured to use Direct Memory Access (DMA) to write to the memory. DMA is a method of writing to a device without passing through a CPU. The data may be sent directly through a physical DMA channel to the memory; the CPU is not involved. This method of memory writing is more efficient than the Program Input Output (PIO) method in which the CPU manages the data transfer. However, the Row Address Signal/Column Address Signal (RAS/CAS) multiplexing creates some overhead.

Since the DRAM circuit is small, many bits may be stored on a single chip making DRAM relatively inexpensive. The relative inexpensiveness of DRAM accounts for its widespread use as computer system RAM. However, the refreshing operation may make DRAM less efficient, and thus slower, and draw more power than other RAM types.

Another type of volatile RAM is static random access memory (SRAM). SRAM stores each bit of data in a flip-flop circuit. The flip-flip circuit may include a group of transistors (e.g., 4 to 6 transistors) and the corresponding wiring, taking up more space than the DRAM circuit. In some embodiments, a large current may be used to overcome the impedance of the circuitry and wiring. SRAM may be configured to use DMA to access the memory directly. The direct access and the lack of a refreshing operation make SRAM faster than DRAM. However its larger circuit size may consume more space providing fewer memory cells per chip, making SRAM more expensive per chip than DRAM.

Non-volatile memory may be referred to as FLASH memory, and uses solid state technology that can still be randomly accessed. Non-volatile RAM may use a battery to draw power to maintain the data. For example, a car radio uses non-volatile RAM to store preset radio stations. The stored preset stations are maintained when the car is turned off, but are lost if the car battery dies. The non-volatile RAM draws power from the battery to maintain the data values. Non volatile memory cards differ from non-volatile RAM in that non-volatile memory cards do not lose data upon power loss. Neither non-volatile RAM nor non-volatile memory cards use a refreshing operation. However, non-volatile RAM (e.g., FLASH memory) and non-volatile memory cards (e.g., FLASH memory cards such as SD™ card) utilize an erase operation prior to writing. That is, non-volatile memory is not able to perform consecutive, or back to back, write operations. Data must be erased prior to the next write. A block of data may be erased at one time using one action, or one "flash." It is from this erase process that the name "FLASH memory" was drawn. The erase process also causes non-volatile RAM and non-volatile memory cards to be too-slow for widespread use, but useful in certain applications, for example as a portable data storage option.

Thus, volatile DRAM is inexpensive, volatile SRAM is fast, Non-volatile RAM retains values when the power is turned off, and a non-volatile memory card is portable and retains values through a power loss. As a result, manufacturers may use a combination of these memory types to be able to offer users differing functionality. For example, an image capture device or a device that includes image capture functionality (e.g., a cell phone) may include several memory types that support device and/or image capture functions, such as DRAM, SRAM, FLASH, and EEPROM. However, mixing memory types may have drawbacks including but not limited to circuitry and software necessary to support interfacing a CPU and/or a memory controller with the various memory types, the extra PC board space required to support each memory type and its associated hardware, increased power consumption and heat dissipation created by multiple memory types, just to name a few. For portable electronic devices, reducing power consumption to extend battery life is a major design goal. There are continuing efforts to improve memory technology in image capture devices.

BRIEF DESCRIPTION OF THE DRAWINGS

The present embodiments will be readily understood by the following detailed description in conjunction with the accompanying drawings, and like reference numerals designate like structural elements.

Although the previous Drawings depict various examples of the invention, the invention is not limited by the depicted examples. Furthermore, the depictions are not necessarily to scale.

DETAILED DESCRIPTION

The present invention may be implemented using numerous means, including as a system, an apparatus, a method, or any combination of those means.

A detailed description of one or more examples is provided below along with accompanying figures. The detailed description is provided in connection with such examples, but is not limited to any particular embodiment. The scope is limited only by the claims, and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

This disclosure describes memory emulation in an image capture device. In some embodiments a non-volatile memory array emulates SRAM, DRAM, or both. In some other embodiments the non-volatile memory array emulates DRAM and non-volatile RAM. In some other embodiments the non-volatile memory array emulates DRAM, non-volatile RAM, and SRAM. In some other embodiments a second non-volatile memory array emulates a non-volatile memory card. These embodiments are for illustration only and the non-volatile memory array and/or non-volatile memory array card can emulate other types and combinations of memory as well.

The above described embodiments may be practiced with other computer system configurations including but not limited to hand-held devices, microprocessor systems, DSP systems, microprocessor-based or programmable consumer electronics, minicomputers, mainframe computers and the like. Although the foregoing invention has been described in some detail for purposes of clarity of understanding, it will be apparent that certain changes and modifications may be practiced within the scope of the claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

Figure 1:
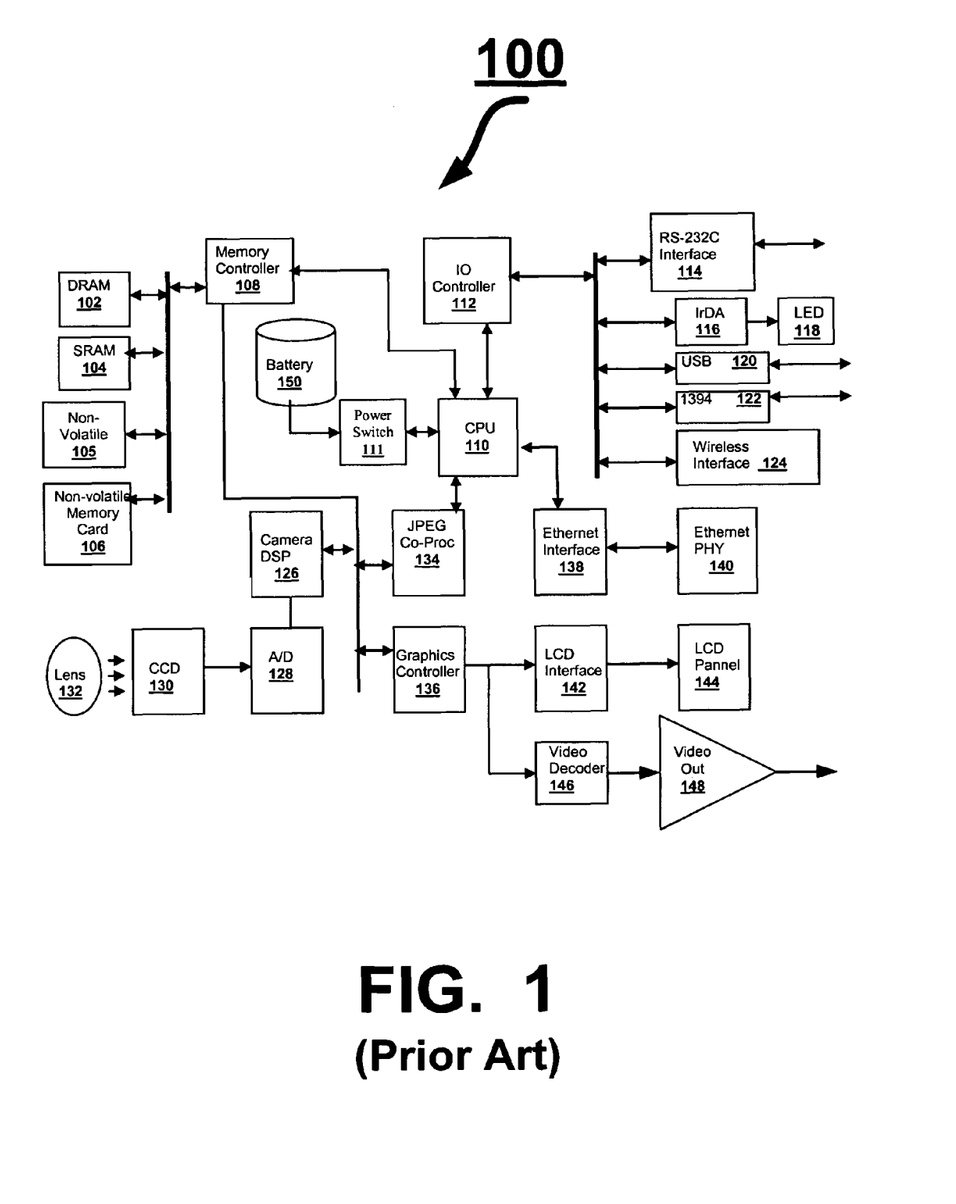
FIG. 1 is an exemplary representation of a conventional image capture device.

FIG. 1 is an exemplary representation of a conventional image capture device 100. The image capture device 100 can include but is not limited to a digital camera, a mobile phone (e.g., a cell phone or cellular telephone), a portable electronic device (e.g., a BlackBerry® or Iphone™),; a computer, a personal digital assistant (PDA), a digital video recorder, a game device (e.g., a portable video game), a video device (e.g., a playback and/or record device), an audio device (e.g., a playback and/or record device), an audio video device, or a device that implements any combination of the aforementioned devices, for example. Image capture device 100 has a central processing unit (CPU) 110. CPU 110 orchestrates the operation of the image capture device 100. CPU 110 is responsible for monitoring inputs and outputs (IO). IO may come from an RS-232C interface 114, an infra red IrDA® interface 116, a Universal Serial Bus (USB) port 120, a 1394 port 122 (e.g., IEEE 1394, FireWire®, i.LINK®), or a wireless interface 124 such as Bluetooth® or a wireless local area network (WLAN). IO Controller 112 monitors the inputs and the outputs and relays required information to CPU 110. CPU 110 may monitor Ethernet interface 138 for activity on Ethernet PHY 140. CPU 110 may precondition and execute data control and data movement.

The conventional image capture device 100 may include several different memory types including dynamic random access memory (DRAM) 102, static random access memory (SRAM) 104, non-volatile memory (FLASH) 105, a removable non-volatile memory card 106 (e.g., a SD™ card), onboard memory that may be read-only memory (ROM), erasable programmable read-only memory (EPROM), and FLASH non-volatile memory. Battery 150 is coupled to the CPU 110 through power switch 111. CPU 110 may manage the power supply by managing power switch 111 which switches battery power among components of the conventional image capture device 100. Data movement may be handled by memory controller 108 using direct memory access (DMA) operations. Memory controller 108 may be coupled to the graphics controller 136. The graphics controller 136 communicates with the liquid crystal display (LCD) interface 142 which communicates with the LCD panel 144. The graphics controller 136 may be coupled to the video decoder 146 which enables video to be sent out the video output 148.

When an image is captured through lens 132, charge-coupled device (CCD) 130 captures the image as an analog signal. Analog to digital converter (A/D) 128 converts the signal to a digital data stream. In another embodiment, a CMOS-based image sensor may convert light directly into electrons eliminating the need for A/D 128. The digital data may be sent to both the digital signal processor (DSP) 126 and to the Joint Photographic Experts Group (JPEG) co-processor 134 where proper encoding transformation takes place. The resulting data may be stored in DRAM 102. Once in DRAM 102, the image may be sent to the non-volatile memory 105, or to non-volatile memory card 106, or the image may be sent to at least one of the I/O ports or interfaces. For example, the image may be sent to RS-232C port 114, Ethernet 140, 1394 interface 122, or wireless interface 124 for transfer to another device for viewing or printing. These interfaces and ports are examples, all image capture devices may not support these interfaces/ports and other emerging interfaces and ports may be added.

Figure 2A:
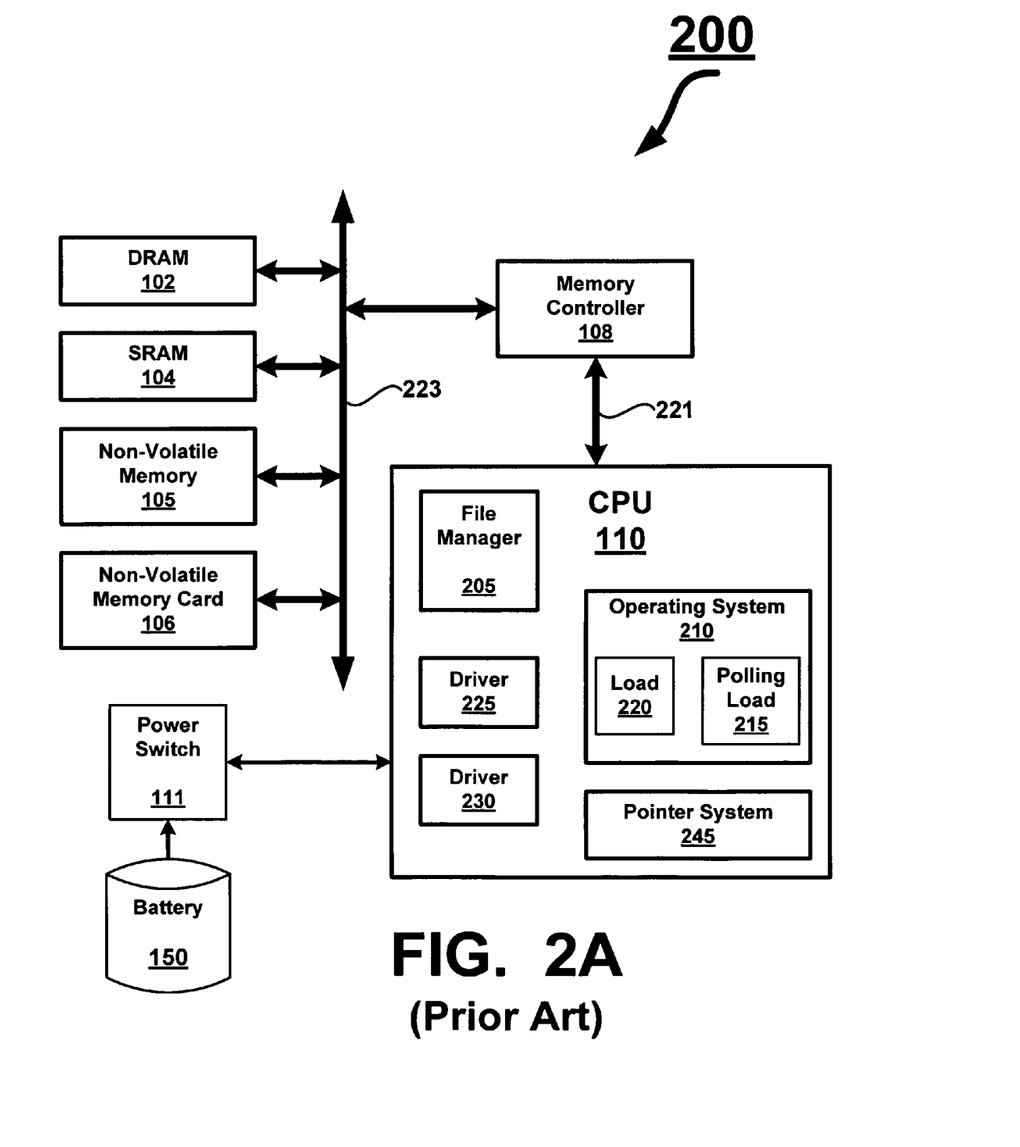
FIG. 2A is an exemplary representation of a conventional memory system of the conventional image capture device depicted in FIG. 1.

FIG. 2A is an exemplary representation of a conventional memory system 200 within the conventional image capture device 100. Memory system 200 includes CPU 110. Within the CPU 110 may be a file manager 205, an operating system 210, and a plurality of drivers 225, and 230. The file manager 205 may be configured to understand the file structure of the non-volatile memory 105 and may be used translates the data from this structure into a form the CPU 110 can use (e.g., from a memory bus 223 to a CPU bus 221). CPU operating system 210 may be used to control the other devices in the conventional image capture device 100 such as memory and I/O, possibly requiring additional drivers.

Each memory type has different infrastructure needs. DRAM 102 uses a refresh operation to maintain its data. This refresh operation may be managed by memory controller 108. The CPU 110 may coordinate the opening and closing of power switch 111 to provide power from battery 150 to DRAM 102. Memory controller 108 may be used to handle both the Direct Memory Access functions (DMA) which manages pointers, read/writes, and interface-to-interface translation functions which translate the data from the memory bus 223 to the CPU bus 221.

SRAM 104 uses flip-flops instead of a capacitance circuit and does not perform a refresh operation. CPU 110 may coordinate the switching on and off of power switch 111 to provide power from battery 150 to SRAM 104 for maintaining data values. If the SRAM 104 is in use, then power is needed. On the other hand, if the SRAM 104 is not in use, then the power may be switched off to conserve power in battery 150. However, like the DRAM 102, the SRAM 104 is volatile and stored data is lost when power is switched off. Memory controller 108 may be used to handle both the Direct Memory Access functions (DMA) which manages pointers, read/writes, and the interface-to-interface translation functions which translate the data from the memory bus 223 to the CPU bus 221.

The erase process of non-volatile memory 105 utilizes high voltages (e.g., 10-13 volts) that erase a block of data at a time. This erase process may be time consuming. FLASH File System software may be used for the purpose of data management of non-volatile memory 105. FLASH File System software may be used to manage the slowness (e.g., speed) and the size of the erase process by moving data between blocks to maximize data concentration and minimize the quantity of erases, and to manage the erase process itself. The CPU 110 may coordinate the switching on and off of power switch 111 to provide power from battery 150 to non-volatile memory 105. When power is supplied to the non-volatile memory 105 and the non-volatile memory 105 is given an erase command, the internal circuitry in the non-volatile memory 105 activates causing charge pumps to generate the aforementioned high voltages and start the logic sequence.

FLASH memory may use a driver, an operating system, and a pointer system. The driver may be used to translate the control parameters used to read, write and erase data. The driver resides in CPU 110 to allow the CPU 110 to drive the FLASH IO. The complexity of the FLASH memory erase process results in the need for the operating system and pointer system. That is, a write operation sets certain bits to a 1 value, and an erase sets all bits in a block to a 0 value. However, writing a 0 to a location that already contains a 1 will have no effect. For example, a byte of written data (in hexadecimal notation) may contain 0x55 (0101 01 01). If the system writes a complimentary pattern of 0xAA (1010 1010) the result is 0xFF (1111 1111) not the desired 0xAA because only the 1 data locations can be written. An erase operation is required in FLASH to set any bit values to 0. It is the operating system that utilizes the pointer system to manage the erase process.

The erase operation may be slow and as such the operating system, sometimes referred to as FLASH File System (FFS), may move data to minimize the number of erases. Data may be moved, that is, written to a new location, instead of performing an erase and write. The location to where the data is moved may be tracked by the pointer system. The pointer system may use overhead data such as markers and address pointer values that are stored in the FLASH memory. The FLASH memory may fill at a more rapid pace due to the moving of data and the storing of the overhead values.

Once a FLASH block is full or contains a large amount of obsolete data (i.e., data that has been moved to a new location) it may be scheduled for erasure. The good data in the block may be moved to SRAM 104 or another FLASH block so that it is retained. If FLASH is used, markers and address pointer values are stored. Then the scheduled erasure can take place. The erase process may include a cycle of erases and reads. The cycle of erases and reads may be continued until all the block values reach the erased state. The erase cycle is slow and uses high voltages for long periods of time which may cause high currents and battery drain. Once in the erased state, the block can accept a write. This multi-step process which includes moving data, tracking addresses, storing overhead values, and erasing, may cause FLASH memory to be slow and impacts the performance of the system as a whole. Moreover, other drawbacks to FLASH memory include the circuitry required to provide the high voltages and the power drain created by the high voltages. For portable devices, it is desirable to minimize power drain and reduce the area taken up by circuitry.

In some embodiments, FLASH File System may run on the CPU 110, consuming a portion of the CPU 110 computing resources and memory. This burden on operating system 210 may be illustrated by FLASH File System load 220. FLASH File System also utilizes file manager 205 and driver 225, and pointer system 245. File manager 205 may be configured to understand the file structure of the non-volatile memory 105 and may be used to translate data from the memory bus 223 to the CPU bus 221. Driver 225 may be used to determine the driving sequences for accessing non-volatile memory 105. Pointer system 245 keeps track of data as was described above.

Non-volatile memory card 106 functions similarly to non-volatile memory 105. The erase process of non-volatile memory 106 may utilize high voltages (e.g., 10-13 volts) that erase a block of data at a time. This erase process may be time consuming. FLASH File System software may be used for the purpose of data management of non-volatile memory card 106. FLASH File System software may be used to manage the slowness (e.g., speed) and the size of the erase process by moving data between blocks to maximize data concentration and minimize the quantity of erases, and to manage the erase process itself.

Data blocks for non-volatile memory card 106 may be a different size than the block size for non-volatile memory 105. The CPU 110 may coordinate the switching on and off of power switch 111 to provide power from battery 150 to non-volatile memory card 106. When power is supplied to the non-volatile memory card 106 and the non-volatile memory card 106 is given an erase command, the internal circuitry in the non-volatile memory card 106 activates causing charge pumps to generate the aforementioned high voltages and start the erase logic sequence.

In one embodiment FLASH File System may run on the CPU 110, consuming a portion of the CPU 110 computing resources and memory. This burden on operating system 210 may be illustrated by FLASH File System load 220. In another embodiment, FLASH File System may run on an on-board controller resident on non-volatile memory card 106. In this embodiment, the operating system 210 is configured to poll the on-board controller to determine if the FLASH memory is available, or busy (i.e., performing an erase operation). The polling function in the operating system may be represented by FLASH File System polling load 215. In either embodiment, the operating system 210 is loaded down with either the FLASH File System itself and with polling for the status of the on-board controller of FLASH memory, or in some other embodiments the CPU 110 is loaded down with both loads 215 and 220.

FLASH File System also utilizes file manager 205, driver 230, and pointer system 245. File manager 205 may be configured to understand the file structure of the non-volatile memory card 106 and may be used to translate data from the memory bus 223 to the CPU bus 221. Driver 230 may be used to determine the driving sequences for accessing non-volatile memory card 106.

There are several drawbacks to the conventional image capture device 100 and the conventional memory system 200. Battery 150 could fail while the image is in volatile memory, such as the DRAM 102 or the SRAM 104, losing the image. The multiple memory types included have different operational methods and place different loads on CPU 110 causing inefficiencies. The erase operation for the non-volatile memories 105 and 106 result in slower system throughput and burden the CPU 110 with additional drivers, loads, and a pointer system.

Non-volatile memory technologies may be used with memory systems to develop high density, low cost, and fast access memories. Access may refer to accessing and performing data operations (e.g., read, write, erase) on a memory or memory array. Preferably, a non-volatile, cross-point, high density memory array that uses direct memory addressing, has a fast read/write capability, and uses neither an erase process, nor any added code in the operating system is used to replace one or more of the aforementioned multiple memory types. Examples of non-volatile memory arrays may include two-terminal or three-terminal cross-point memory arrays configured as a single layer array or as multiple layer vertically-stacked arrays. An exemplary non- volatile two-terminal cross-point memory array is described in U.S. patent application Ser. No. 11/095,026, filed Mar. 30, 2005, now U.S. Published Application No. 2006/0171200, and titled "Memory Using Mixed Valence Conductive Oxides," hereby incorporated by reference in its entirety and for all purposes. The application describes non-volatile third dimension memory cells that can be arranged in a cross-point array and describes a two terminal memory element that changes conductivity when exposed to an appropriate voltage drop across the two terminals. The memory element includes both a mixed ionic electronic conductor and a layer of material that has the bulk properties of an electrolytic tunnel barrier (i.e., properties of an electronic insulator and an ionic conductor). A voltage drop across the electrolytic tunnel barrier causes an electrical field within the mixed ionic electronic conductor that is strong enough to move oxygen ($0_2$) ions out of the mixed ionic electronic conductor and into the electrolytic tunnel barrier. Oxygen depletion causes the mixed ionic electronic conductor to change its conductivity. Both the electrolytic tunnel barrier and the mixed ionic electronic conductor do not need to operate in a silicon substrate, and, therefore, can be fabricated above circuitry being used for other purposes (e.g., selection circuitry, sense amps, and address decoders). A memory is "third dimension memory" when it is fabricated above other circuitry components, the components usually including a silicon substrate, polysilicon layers and, typically, metallization layers, for example.

The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{W1}$ is applied across the memory element, (typically by applying $\tfrac{1}{2} V_{W1}$ to the x-direction line and $\tfrac{1}{2} -V_{W1}$ to the y-direction line) it switches to a low resistive state. When a second write voltage $V_{W2}$ is applied across the memory element, (typically by applying $\tfrac{1}{2} V_{W2}$ to the x-direction line and $\tfrac{1}{2} -V_{W2}$ to the y-direction line) it switches to a high resistive state. Typically, memory elements using electrolytic tunnel barriers and mixed ionic electronic conductors require $V_{W1}$ to be opposite in polarity from $V_{W2}$. Typically, a magnitude of the voltage applied across the memory element for data operations (e.g., read or write) is less than approximately 10 volts. More preferably, the magnitude of the voltage applied across the memory element is less than approximately 7 volts.

In applications requiring high density data storage in a small footprint memory device, two-terminal cross-point memory arrays are preferable over three-terminal cross-point memory arrays because the extra area required to route the interconnect lines that electrically couple with the third terminal in the three-terminal cross-point memory array reduces areal density and increases die size and device footprint. Therefore, given the same die size, a two-terminal cross-point memory array will have a higher data storage density than the three-terminal cross-point memory array. An image capture device can incorporate one or more of the non-volatile cross-point memory arrays to replace some or all of the aforementioned multiple memory types (e.g., DRAM, SRAM, FLASH, FLASH memory cards, ROM, and EEPROM).

Figure 2B:
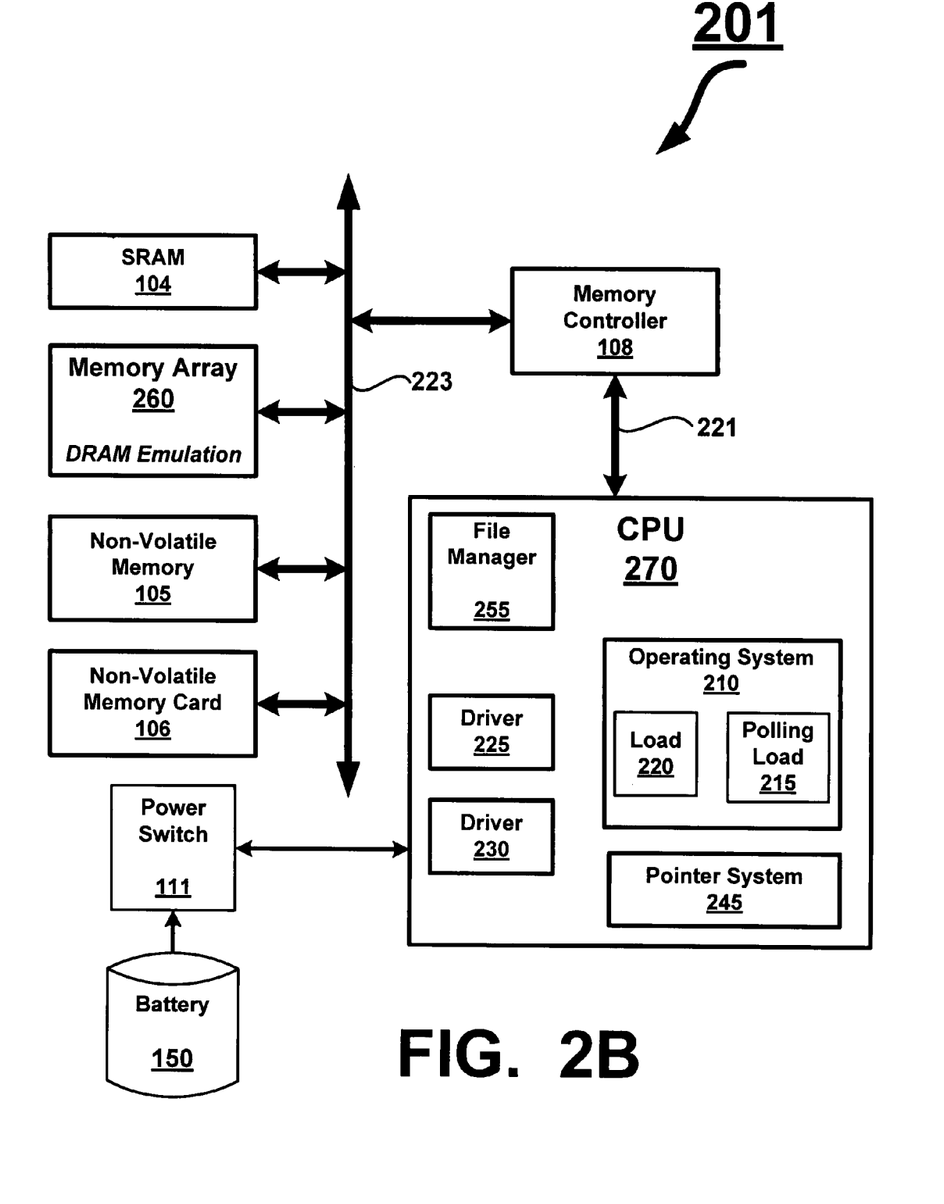
FIG. 2B is an exemplary representation of a memory system in an image capture device using a non-volatile memory array to replace and emulate a DRAM.

The memory array can emulate multiple memory types and may be used to replace any one or combination of those memory types. For example, FIG. 2B is an exemplary representation of a memory system 201 in which a non-volatile memory array 260 may be used to replace and emulate DRAM 102. That is, non-volatile memory array 260 can be accessed randomly using DMA while eliminating the need for the refresh operation thus improving CPU operations. File manager 255 may be configured to understand the file structure of the non-volatile memory array 260 and may be used to translate data from the non-volatile memory array 260 to the CPU bus 221. Memory controller 108 may be used to perform DMA functions for the non-volatile memory array 260. CPU 270 includes operating system 210 bearing polling and system loads 215 and 220 respectively. In this system, the DRAM 102 described above in reference to FIGS. 1 and 2A, has been replaced with the non-volatile memory array 260 thus eliminating the need for the refresh operation while maintaining random access and DMA functions at the same time adding non-volatility to the memory function. Therefore, power switch 111 can remove power from non-volatile memory array 260 and data is retained in the absence of power.

Figure 2C:
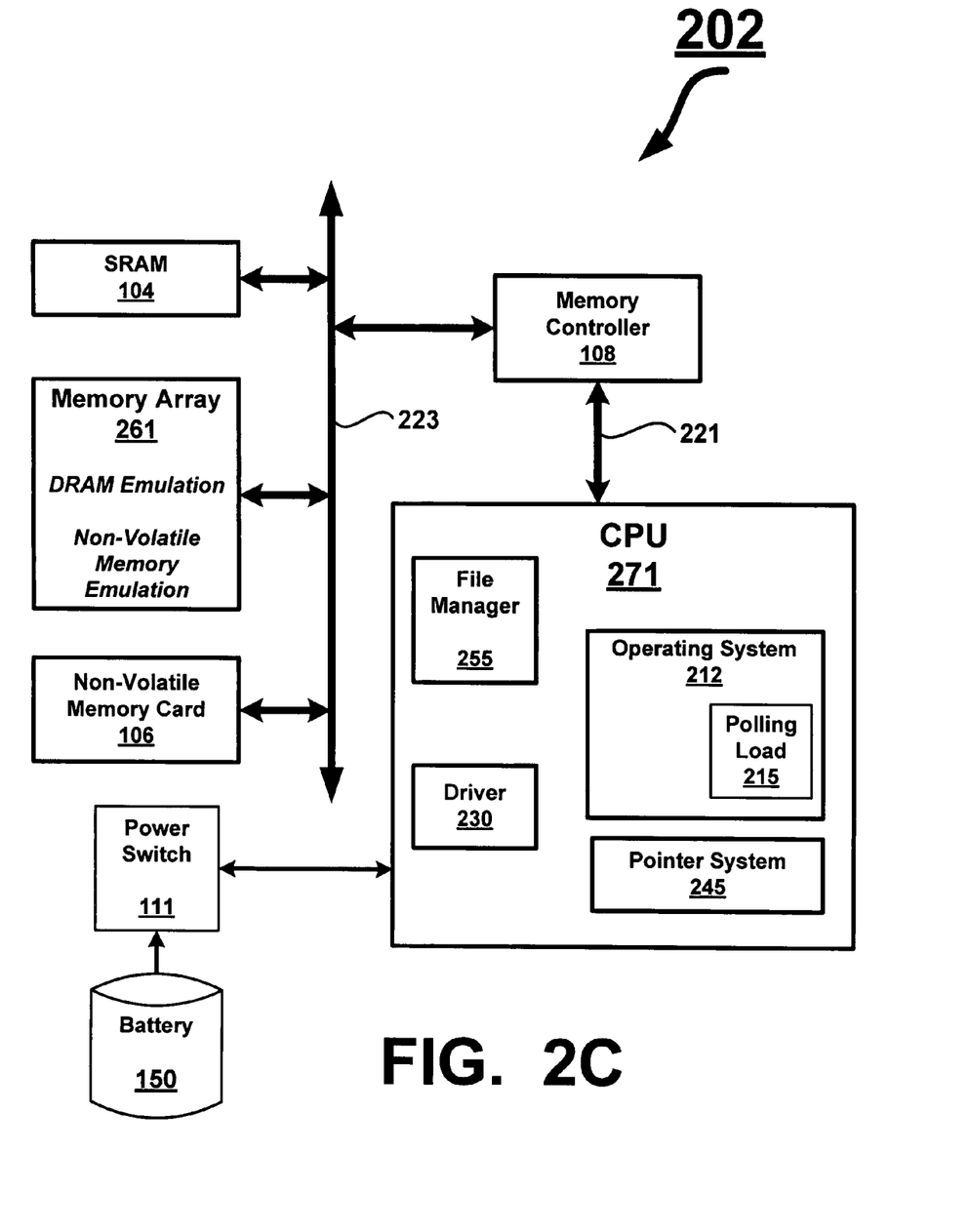
FIG. 2C is an exemplary representation of a memory system in an image capture device using a non-volatile memory array to replace and emulate both a DRAM and a non-volatile memory.

FIG. 2C is an exemplary representation of a memory system 202 in which a non-volatile memory array 261 may be used to replace and emulate a combination of memory types. Non-volatile memory array 261 replaces and emulates the DRAM 102 and the non-volatile memory 105. That is, non-volatile memory array 261 can be accessed randomly using DMA while eliminating the need for either the refresh operation such as that used with DRAM 102, or the erase operation such as that used with non-volatile memory 105, thus simplifying CPU operations. File manager 255 may be configured to understand the file structure of the non-volatile memory array 261 and may be used to translate data from the non-volatile memory array 261 to the CPU bus 221. Memory controller 108 may be used to perform DMA functions for the non-volatile memory array 261. CPU 271 includes operating system 212 bearing polling load 215. Note that the FLASH File System load 220 has been eliminated from operating system 212. In this system, the DRAM 102 and the non-volatile memory 105 have been replaced with non-volatile memory array 261 thus eliminating the need for the refresh operation associated with DRAM 102 and the erase operation associated with non-volatile memory 105 while maintaining random DMA read/write access and adding non-volatile functionality to the memory by replacing the DRAM 102 with non-volatile memory array 261.

Figure 2D:
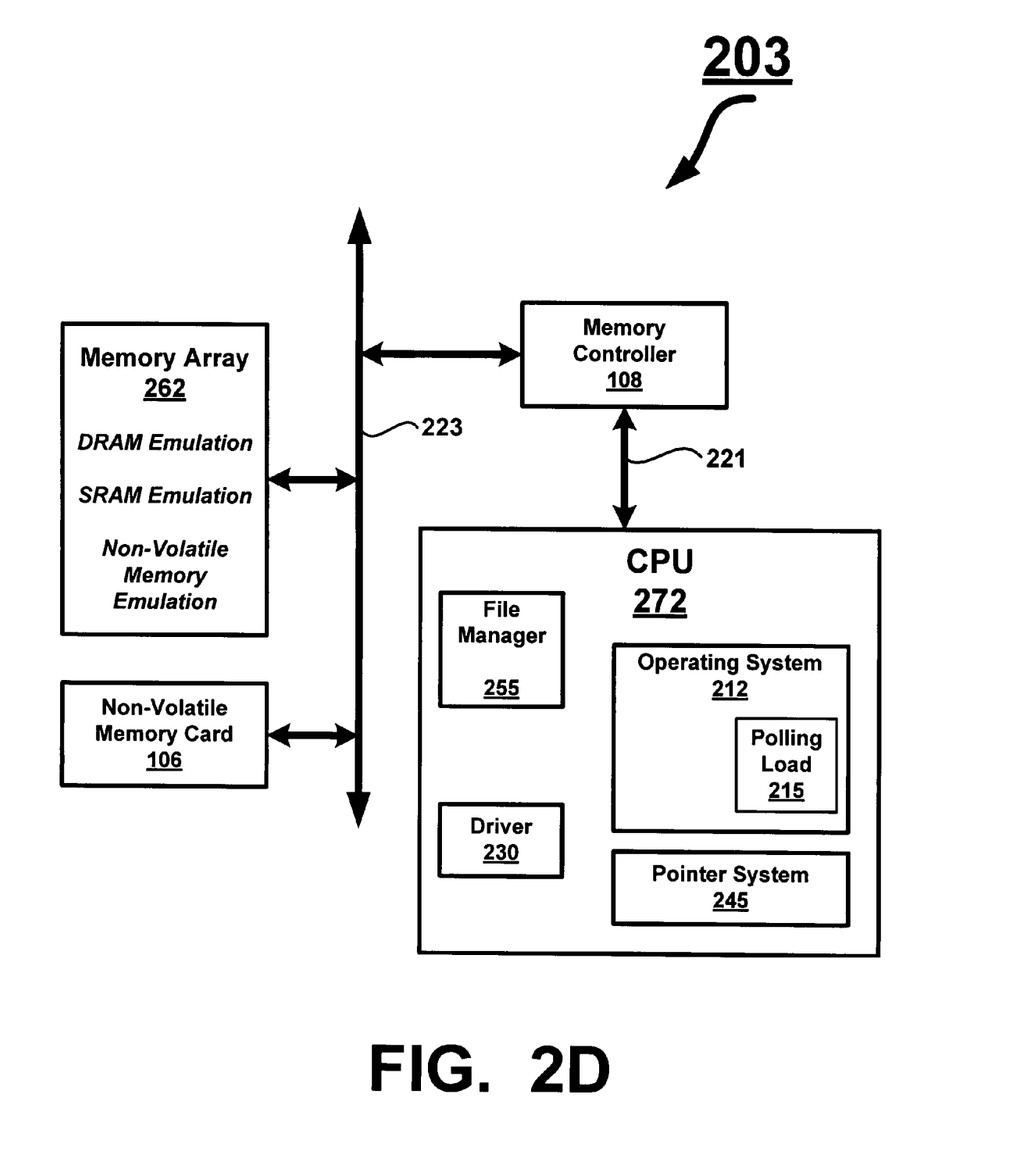
FIG. 2D is an exemplary representation of a memory system in an image capture device using a non-volatile memory array to replace and emulate a DRAM, a non-volatile memory, and a SRAM.

FIG. 2D is an exemplary representation of a memory system 203 in which a non-volatile memory array 262 may be used to replace and emulate a combination of memory types including DRAM 102, non-volatile memory 105, and SRAM 104. That is, non-volatile memory array 262 can be directly accessed randomly using DMA while eliminating the need for either the refresh operation such as that used with DRAM 102, the erase operation such as that used with non-volatile memory 105, or selecting a subsection of memory for a particular purpose such as a scratchpad in the SRAM 104, thus simplifying operations for CPU 272. File manager 255 may be configured to understand the file structure of the non-volatile memory array 262 and may be used to translate data from the non-volatile memory array 262 to the CPU bus 221. Memory controller 108 may be used to perform DMA functions for the non-volatile memory array 262. CPU 272 may include file manager 255, non-volatile memory card 106, driver 230, and operating system 212 bearing polling load 215. Note that the FLASH File System load 220 described in reference to FIG. 2A has been eliminated from operating system 212. In this system, the DRAM 102, and the non-volatile memory 105, and SRAM 104 have been replaced with the non-volatile memory array 262 thus eliminating the need for the refresh operation associated with DRAM 102, eliminating the erase operation associated with non-volatile memory 105, and eliminating the expense associated with SRAM 104 while maintaining fast random DMA read/write access and adding non-volatile in place of the volatile functionality of SRAM 104 and DRAM 102 memory. In some embodiments, DMA functions may be maintained or added as well.

Figure 2E:
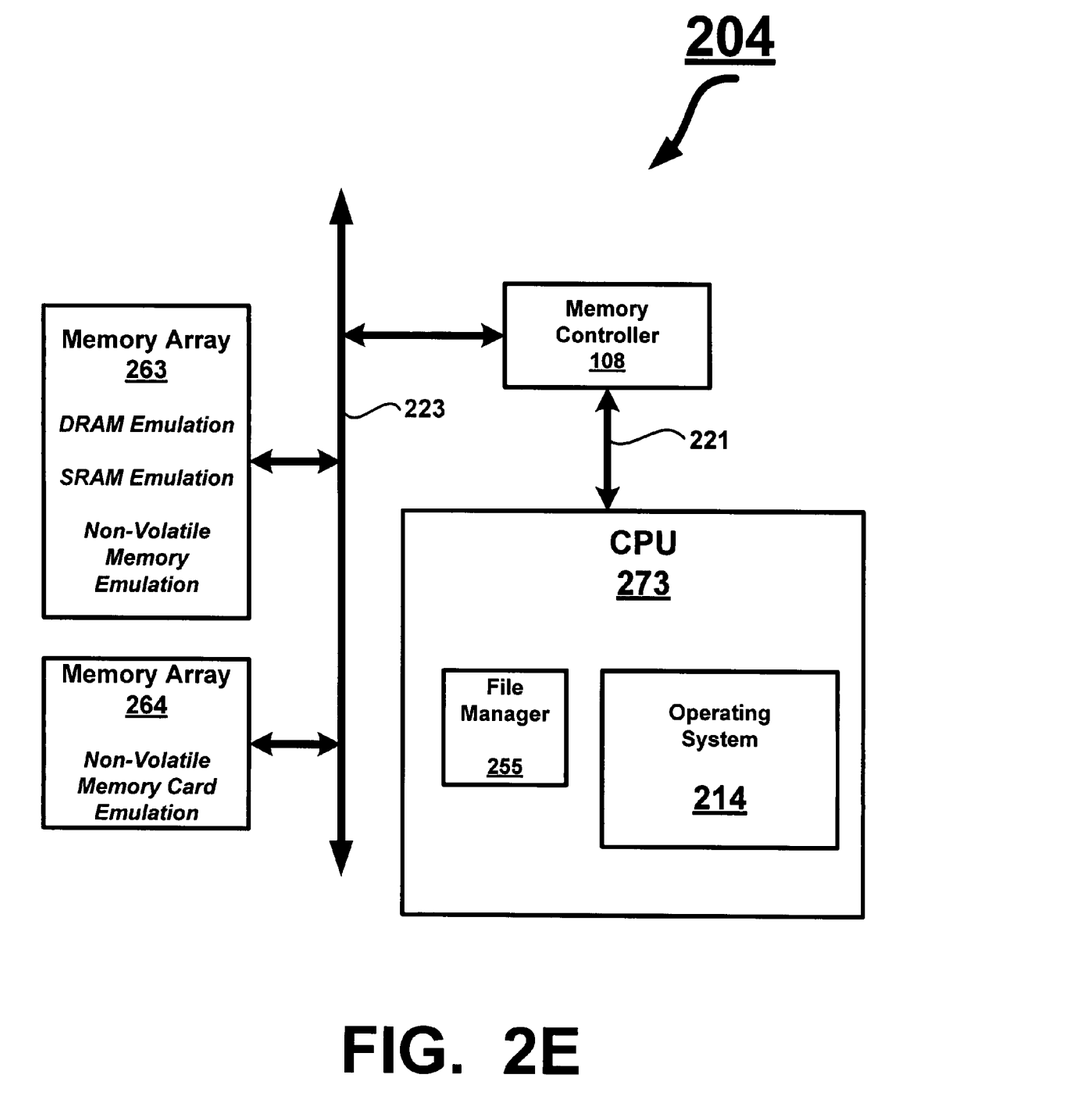
FIG. 2E is an exemplary representation of a memory system in an image capture device using a non-volatile memory array to replace and emulate a DRAM, a non-volatile memory, a SRAM, and using a non-volatile memory array card to replace a non-volatile memory card.

FIG. 2E is an exemplary representation of a memory system 204 in which a non-volatile memory array 263 may be used to replace and emulate a combination of DRAM 102, non-volatile memory 105, and SRAM 104 and a non-volatile memory array 264 may be used to replace and emulate non-volatile memory card 106. That is, memory array 264 may be accessed randomly using DMA while eliminating the need for erase operation such as that used with memory card 106 (e.g., FLASH RAM), thus improving CPU operations. File manager 255 may be configured to understand the file structure of the non-volatile memory array 263 and the non-volatile memory array 264 and may be used to translate data from the non-volatile memory arrays 263 and 264 to the CPU bus 221. Memory controller 108 may be used to perform DMA functions for non-volatile memory arrays 263 and 264. CPU 273 includes operating system 214. Note that the FLASH File System load 220, polling load 215, and pointer system 245 have been eliminated from operating system 214. In this system, the DRAM 102, the non-volatile memory 105, and SRAM 104 have been replaced with non-volatile memory array 263, while non-volatile memory card 106 has been replaced with non-volatile memory array 264 thus eliminating the need for the refresh operation associated with DRAM 102, eliminating the erase operation associated with both the non-volatile memory 105 and non-volatile memory card 106, and eliminating the expense associated with SRAM 104 while maintaining fast DMA read/write access, portable storage features, and non-volatile memory functionality. In some embodiments the replacement of SRAM 104, DRAM 102, and non-volatile memory 105 (e.g., FLASH RAM) may be implemented using a single non-volatile memory array. In some other embodiments, the replacement of SRAM 104, DRAM 102, and non-volatile memory 105 (e.g., FLASH RAM) may be implemented using a plurality of separate non-volatile memory arrays. In an image capture device configured to accept a plurality of non-volatile memory cards 106, one or more of the non-volatile memory array cards 264 may be used to replace the non-volatile memory cards 106. When all of the non-volatile memory cards 106 are replaced by the non-volatile memory array cards 264, the aforementioned polling load 215 and driver 230 can be eliminated.

Figure 3:
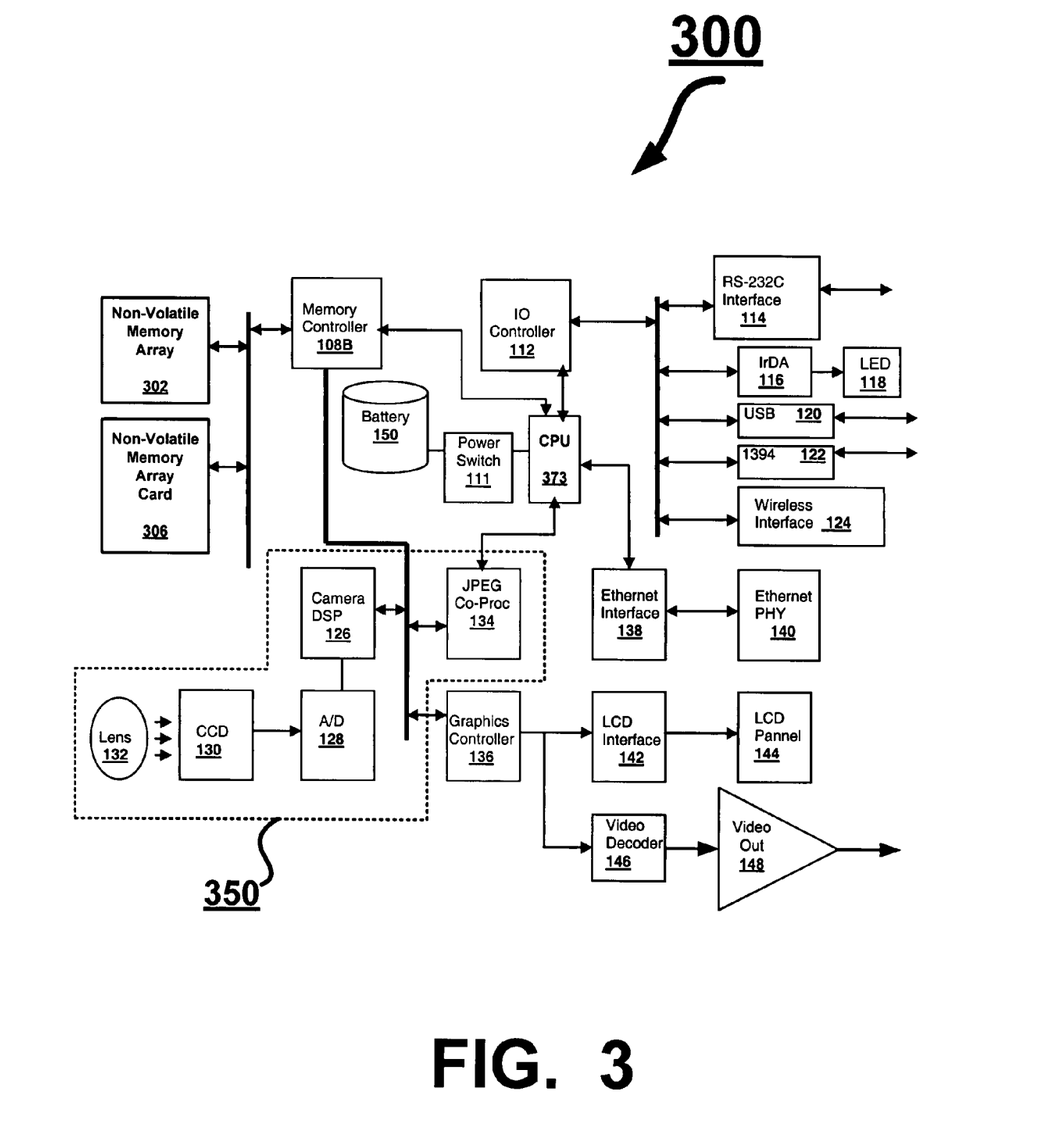
FIG. 3 is an exemplary representation of an image capture device using a non-volatile memory array and a non-volatile memory array card to replace multiple memory types.

FIG. 3 depicts an exemplary image capture device 300 using non-volatile memory array technology. Non-volatile memory array 302 has replaced and emulates DRAM 102, SRAM 104 and non-volatile memory 105 and removable non-volatile memory array card 306 has replaced and emulates the removable non-volatile memory card 106 in the image capture device 300. This system uses directly accessed non-volatile memory arrays and therefore has eliminated inefficiencies in memory processing for image capture devices. The refresh process has been eliminated. The erase process has been eliminated. The FLASH File System has been eliminated. The drivers, pointers, and loads for the FLASH memory have been eliminated. Data movement processes associated with FLASH memory have been eliminated. Elimination of CPU 373 burdening activity results in a more efficient image capture device 300.

For example, an image may be input via lens 132 and converted to analog signals by CCD 130. Analog to digital converter 128 may convert the analog signal into a digital signal. The digital signal may be input into DSP 126 and stored directly into non-volatile memory array 302 or into removable non-volatile memory array card 306 using DMA technology. JPEG processor 134 may process the digital signal from DSP 126 and communicate processed data to the CPU 373. Collectively, the components necessary to capture an image and process it for storage in one or more non-volatile memory arrays and/or non-volatile memory array cards are denoted as image capture system 350 as depicted inside the dashed lines. Some or all of the components in image capture system 350 may be used for capturing and processing an image. The CPU 373 may not be involved in the storage of the image into either of the non-volatile memory arrays 302 and/or 306. The configuration depicted for the image capture device 300 is an example only and other configuration of components are possible and in many instances, the components used and their interconnection will be application specific. For example, DSP 126 may communicate directly with CPU 373 instead of memory controller 108B, or it may communicate with both the CPU 373 and memory controller 108B.

One skilled in the art will appreciate that the image capture device 300 can include more than one removable non-volatile memory array card 306, for example, the image capture device 300 can include a plurality of card slots with each card slot operative to receive a removable non-volatile memory array card 306. The data storage capacity of the removable non-volatile memory array cards 306 need not be identical. Moreover, the image capture device 300 can include more than one non-volatile memory array 302. For example, one non-volatile memory array 302 can replace and emulate SRAM 104 and non-volatile memory 105 and another non-volatile memory array 302 can replace and emulate DRAM 102. The image capture device 300 can include additional memory slots (not shown) that allow for memory capacity to be increased or decreased by adding or removing non-volatile memory arrays 302 to/from available memory slots. As one example, in an image capture system where DRAM is replaced and emulated by non-volatile memory array 302, emulated DRAM storage capacity can be increased by adding one or more additional non-volatile memory arrays 302 to available memory slots (e.g., slots on a PC Board). Moreover, data stored in the non-volatile memory array(s) can include data other than image data. For example, stored data can include but is not limited to file data, audio data, compressed data, packet data, video data, program data, and executable code data, just to name a few.

What is claimed is:

1. An image capture device, comprising:
   an image capture system operative to capture an image and process the image into image data;
   a memory controller;
   a processing unit electrically coupled with the image capture system and the memory controller, the processing unit including an operating system (OS) and a file manager, the processing unit electrically coupled with the memory controller via a CPU bus; and
   at least one non-volatile two-terminal cross-point memory array that is directly accessed, the non-volatile two-terminal cross-point memory array is electrically coupled with the memory controller and is operative to store data including the image data in a plurality of memory elements with each memory element having exactly two terminals and configured to store the data as a plurality of resistive states, and the at least one non-volatile two-terminal cross-point memory array is operative to replace and emulate both volatile and non-volatile memory and is configured for write operations without a FLASH File System (FFS) and without a FLASH erase operation prior to a write operation,
   wherein the OS is configured to coordinate memory I/O functions without FLASH polling loads, without FLASH system loads, and without a FLASH pointer system, and
   wherein the file manager is specifically configured to understand a file structure of the at least one non-volatile two-terminal cross-point memory array and to translate data from the at least one non-volatile two-terminal cross-point memory array to the CPU bus.

2. The image capture device of claim 1, wherein the at least one non-volatile two-terminal cross-point memory array is randomly accessed.

3. The image capture device of claim 1, wherein the memory controller includes a direct memory access (DMA) channel, and the data is accessed by the DMA channel operating in cooperation with the file manager.

4. The image capture device of claim 1, wherein the at least one non-volatile two-terminal cross-point memory array is operative to replace and emulate dynamic random access memory (DRAM) and the data is retained in the absence of electrical power.

5. The image capture device of claim 4, wherein the data is retained without a refresh operation to the at least one non-volatile two-terminal cross-point memory array.

6. The image capture device of claim 1, wherein the at least one non-volatile two-terminal cross-point memory array is operative to replace and emulate static random access memory (SRAM) and the data is retained in the absence of power.

7. The image capture device of claim 1, wherein the at least one non-volatile two-terminal cross-point memory array is operative to replace and emulate non-volatile random access memory (FLASH) and the data is retained in the absence of electrical power.

8. The image capture device of claim 7, wherein the at least one non-volatile two-terminal cross-point memory array is operative to perform consecutive write operations.

9. The image capture device of claim 1, wherein the at least one non-volatile two-terminal cross-point memory array is operative to replace and emulate a removable non-volatile memory card, the data is retained in the absence of electrical power, and the data is retained when the at least one non-volatile two-terminal cross-point memory array is removed from the image capture device.

10. The image capture device of claim 9, wherein the at least one non-volatile two-terminal cross-point memory array is operative to perform consecutive write operations.

11. The image capture device of claim 1, wherein the image capture device is a component of a device selected from the group consisting of a cell phone, a digital camera, a computer, a digital video recorder, a game, a personal digital assistant (PDA), a video device, an audio device, and any combination of those devices.

12. The image capture device of claim 1, wherein data operations to the at least one non-volatile two-terminal cross-point memory array occur at a potential difference that is less than approximately 10 volts.

13. The image capture device of claim 1, wherein the at least one non-volatile two-terminal cross-point memory array is vertically stacked.

14. An image capture device comprising:
   an image capture system operative to capture an image and process the image into image data;
   a memory controller;
   a processing unit electrically coupled with the image capture system and the memory controller, the processing unit including an operating system (OS) and a file manager, the processing unit electrically coupled with the memory controller via a CPU bus; and
   a plurality of non-volatile two-terminal cross-point memory arrays that are directly accessed, the plurality of non-volatile two-terminal cross-point memory arrays are electrically coupled with the memory controller and are operative to store data including the image data in a plurality of memory elements with each memory element having exactly two terminals and configured to store the data as a plurality of resistive states, the plurality of non-volatile two-terminal cross-point memory arrays are operative to replace and emulate both volatile and non-volatile memory, the plurality of non-volatile two-terminal cross-point memory arrays are configured for write operations without a FLASH File System (FFS) and without a FLASH erase operation prior to a write operation, and the data is retained in the absence of electrical power,
   wherein the OS is configured to coordinate memory I/O functions without FLASH polling loads, without FLASH system loads, and without a FLASH pointer system, and
   wherein the file manager is specifically configured to understand a file structure of the plurality of non-volatile two-terminal cross-point memory arrays and to translate data from the plurality of non-volatile two-terminal cross-point memory arrays to the CPU bus.

15. The image capture device of claim 14, wherein the memory controller includes a direct memory access (DMA) channel, and the data is accessed by the DMA channel operating in cooperation with the file manager.

16. The image capture device of claim 14, wherein at least one of the plurality of non-volatile two-terminal cross-point memory arrays is operative to replace and to emulate a memory type selected from the group consisting of dynamic random access memory (DRAM), static random access memory (SRAM), non-volatile random access memory (FLASH), a removable non-volatile memory card, and any combination of those memory types.

17. The image capture device of claim 16, wherein the data is retained without a refresh operation to the at least one of the plurality of non-volatile two-terminal cross-point memory arrays.

18. The image capture device of claim 14, wherein the at least one of the plurality of non-volatile two-terminal cross-point memory arrays is operative to perform consecutive write operations.

19. The image capture device of claim 14, wherein the image capture device is a component of a device selected from the group consisting of a cell phone, a digital camera, a computer, a digital video recorder, a game, a personal digital assistant (PDA), a video device, an audio-video device, and any combination of those devices.

20. The image capture device of claim 14, wherein data operations to the plurality of non-volatile two-terminal cross-point memory arrays occur at a potential difference that is less than approximately 10 volts.

21. The image capture device of claim 14, wherein at least one of the plurality of non-volatile two-terminal cross-point memory arrays is vertically stacked.

22. The image capture device of claim 14, wherein a portion of at least one of the plurality of non-volatile two-terminal cross-point memory arrays is operative as a scratch pad for the processing unit.

* * * * *